United States Patent
Johnson et al.

(10) Patent No.: US 7,345,354 B2
(45) Date of Patent: Mar. 18, 2008

(54) INCREASED QUALITY FACTOR OF A VARACTOR IN AN INTEGRATED CIRCUIT VIA A HIGH CONDUCTIVE REGION IN A WELL

(75) Inventors: Debra Johnson, Fleetwood, PA (US); Shye Shapira, Allentown, PA (US); Shahriar Moinian, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 79 days.

(21) Appl. No.: 10/918,981

(22) Filed: Aug. 16, 2004

(65) Prior Publication Data

US 2005/0023645 A1    Feb. 3, 2005

Related U.S. Application Data

(62) Division of application No. 10/454,133, filed on Jun. 4, 2003, now Pat. No. 6,825,089.

(51) Int. Cl.
   *H01L 29/76* (2006.01)
(52) U.S. Cl. .................... 257/602; 257/595
(58) Field of Classification Search ............. 257/595, 257/602
   See application file for complete search history.

(56) References Cited

U.S. PATENT DOCUMENTS

| 5,405,790 | A | 4/1995 | Rahim et al. |
| 5,547,880 | A * | 8/1996 | Williams et al. ............ 438/420 |
| 5,965,912 | A | 10/1999 | Stolfa et al. |
| 6,100,770 | A | 8/2000 | Litwin et al. |
| 6,686,640 | B2 | 2/2004 | Mheen et al. |
| 2001/0042879 | A1 * | 11/2001 | Ghilardelli et al. ......... 257/296 |

FOREIGN PATENT DOCUMENTS

JP        02209776 A    8/1990

OTHER PUBLICATIONS

Parent case U.S. Appl. No. 10/454,133, filed on Jun. 4, 2003 entitled "Increased Quality Factor of a Varactor in an Integrated Circuit Via a High Conductive Region in a Well" to Shye Shapira et al.; allowed on May 24, 2004.

* cited by examiner

*Primary Examiner*—Thomas L. Dickey

(57) ABSTRACT

The present invention provides an varactor, a method of manufacture thereof. In an exemplary embodiment, the varactor includes a semiconductor substrate and well of a first and second conductivity type, respectively. A conductive region in the well has a same conductivity type as the well but a lower resistivity than the well. At least a portion of the well is between at least two sides of the conductive region and an area delineated by an outer perimeter of a conductive layer over the well. Such varactors have a lower series resistance and therefore have an increased quality factor.

6 Claims, 5 Drawing Sheets

$N/jwC_0$         $1/jwC_0$ $R_0$         $R_0/N$

N parallel connected square segments of capacitors with 1/N Area $$Z_{tot} = \frac{jwC_0R_0/N+1}{jwC_0R}$$

Varactor of area A segmented into N units of area 1/N $1/jwC_0$ $R_0$ $$Z_{tot} = \frac{jwC_0R_0+1}{jwC_0R}$$

INCREASED QUALITY FACTOR OF A VARACTOR IN AN INTEGRATED CIRCUIT VIA A HIGH CONDUCTIVE REGION IN A WELL

This Application is a Divisional of prior application Ser. No. 10/454,133 filed on Jun. 4, 2003 now U.S. Pat. No. 6,825,089, to Shye Shapira, et. al. The above-listed Application is commonly assigned with the present invention and is incorporated herein by reference as if reproduced herein in its entirety under Rule 1.53(b).

TECHNICAL FIELD OF THE INVENTION

The present invention is directed, in general, to a varactor design and, more specifically, a high quality large capacitance varactor having an increased ratio of capacitance to area for the varactor and a method of manufacture thereof.

BACKGROUND OF THE INVENTION

Portable telecommunications applications place stringent requirements on the design of oscillators, such as voltage-controlled oscillators, in transceivers. The oscillator should have a large tuning range with minimal noise, low power dissipation, low manufacturing cost, and limited susceptibility to crosstalk from other circuits.

The design of varactors, also known as a voltage variable capacitors, is an important aspect of optimizing such oscillators. Both P/N junction semiconductor and metal oxide semiconductor (MOS) capacitors are commonly used. Semiconductor varactor designs are subject to three general considerations: (1) maximize capacitance per unit area occupied by the varactor, (2) maximize the voltage controllable variable capacitance range of the varactor, and (3) maximize the quality factor (Q) of the varactor. Designing and manufacturing semiconductor varactors in which all three considerations have been optimized remains problematic.

For example, certain MOS varactors, may use low doped wells biased with respect to a conductive layer, such as a MOS-type gate, to vary the gate-controlled capacitance in a channel region of the well below the gate. The low doping density of the well, however, has a high series resistance, which in turn degrades the Q of the varactor. Alternatively, the use of a heavily doped channel, while minimizing series resistance may also substantially eliminate voltage controllable variable capacitance.

Previous attempts to resolve this problem have focused on reducing the device dimensions, allowing large perimeters with highly conductive contacts. Such attempts, however, result in devices having a large area to capacitance ratio. Moreover the device has substantial substrate pickup due to the large device area overlapping with the substrate.

Others have attempted to increase the total variable capacitance of P/N junction semiconductor capacitors by implanting P+ into a N-epitaxial layer. Such capacitors are expected, however, to have a small capacitance variation with voltage bias as they implement a pn junction. Increasing their quality factor requires an extra processing step, the growth of a of heavily doped buried layer, that is not commensurate with the CMOS process.

Accordingly, what is needed in the art is a semiconductor varactor with a high capacitance per unit area, high variable capacitance and high quality factor.

SUMMARY OF THE INVENTION

A new semiconductor varactor design is presented to address the above-discussed deficiencies of the prior art. In one embodiment of the present invention, the semiconductor varactor comprises a semiconductor substrate of a first conductivity type and a well of a second conductivity type in the semiconductor substrate. The semiconductor varactor further comprises a conductive layer over the well and a conductive region in the well. The conductive region has a same conductivity type as the well but with a lower resistivity than the well and at least a portion of the well is between at least two sides of the conductive region and an area delineated by an outer perimeter of the conductive layer.

In another embodiment, the present invention provides a method of manufacturing a semiconductor varactor. The method comprises providing a semiconductor substrate of a first conductivity type, forming a well and locating a conductive region in the semiconductor substrate. The conductive region has the same conductivity type as the well but with a lower resistivity than the well. The method further includes forming a conductive layer over the well such that at least a portion of the well is between at least two sides of the conductive region and an area delineated by an outer perimeter of the conductive layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

Understanding the invention may be facilitated from the following detailed description and accompanying Figures. In accordance with the standard practice in the semiconductor industry, various features may not be drawn to scale. Rather, the dimensions of the various features may be arbitrarily increased or reduced for clarity of discussion. Reference is now made to the following descriptions taken in conjunction with the accompanying drawings, in which.

DETAILED DESCRIPTION

The present invention recognizes that the deficiencies associated with previous varactor designs can be avoided by locating a conductive region in the well under the conductor layer of a varactor. As further explained below, this greatly reduces the series resistance associated with the varactor, with concomitant increase in Q with only a small loss in variable capacitance.

Figure 1:
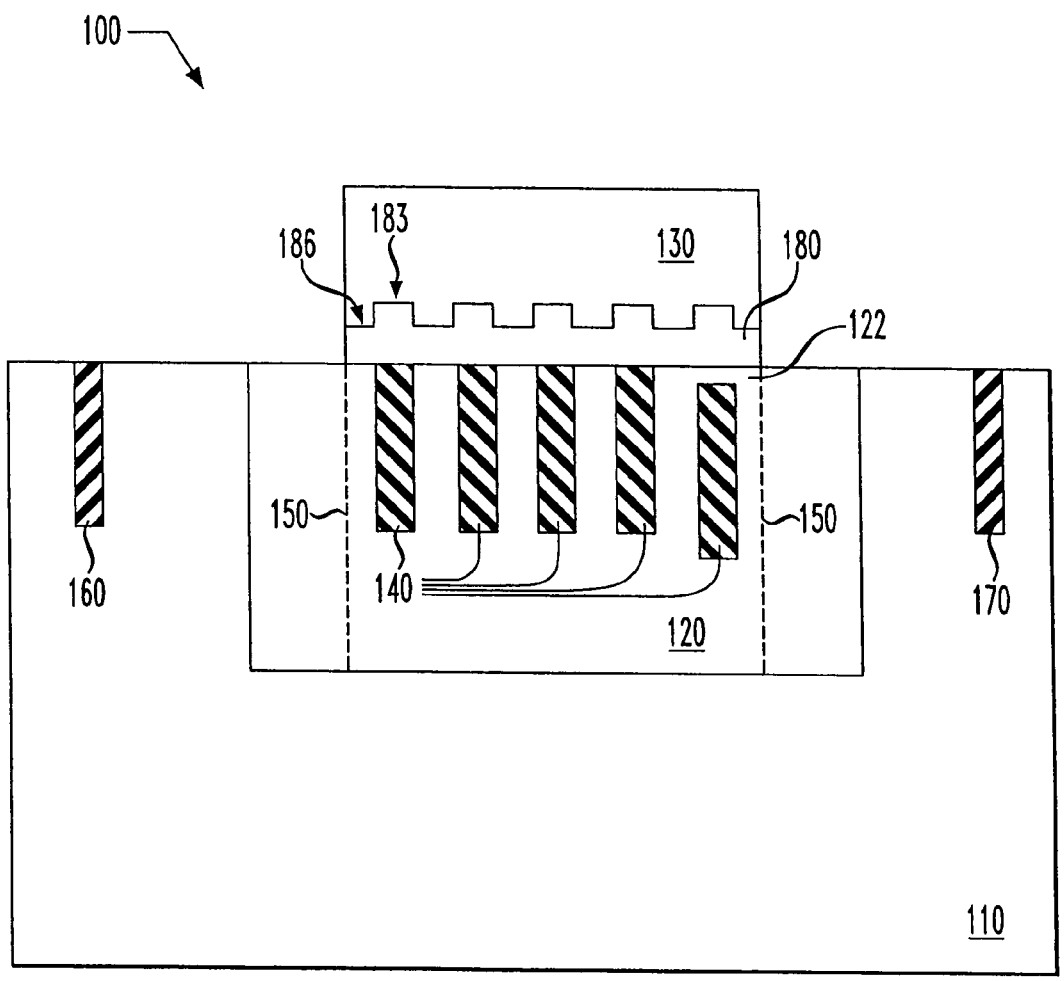
FIG. 1 illustrates a cross-sectional view of a semiconductor varactor, which has been constructed in accordance with the principles of the present invention.

FIG. 1, illustrates a cross-sectional view of one embodiment of such a semiconductor varactor 100. The varactor 100 includes a semiconductor substrate 110 of a first conductivity type and a well 120 of a second conductivity type in the semiconductor substrate 110. The varactor further includes a conductive layer 130 over the well 120 and a conductive region 140 in the well 120. The conductive region 140 has a same conductivity type as the well 120 but a lower resistivity than the well 120. Moreover, at least a portion of the well 120 is between at least two sides of the conductive region 140 and an area delineated by an outer perimeter of the conductive layer 130, depicted in FIG. 1 by dashed lines 150.

In certain preferred embodiments, the conductive layer 130 is of an opposite conductivity type as the well 120. In other preferred embodiments, the semiconductor substrate 110 is a p-type substrate, the well 120 is a n-type well, the conductive region 140 is an N+ region, and the conductive layer 130 is polysilicon or metal. In certain preferred embodiments, the conductive region 140 has a resistivity that is at least 10 times lower than the resistivity of the well 120.

In alternative embodiments, however, the conductivity type of the semiconductor substrate 110 and the well 120 are substantially equal. Thus, in certain such embodiments, the well 120 is simply a portion of the substrate 110. In such embodiments, the conductive region 140 has a same conductivity type as the substrate 110 but a lower resistivity than the substrate 110.

The semiconductor varactor 100 may further include first and second contacts 160, 170. In certain preferred embodiments, the semiconductor varactor 100 is a metal oxide semiconductor varactor that further includes an insulating layer 180 above and preferably on the well 120. In such embodiments, the conductive layer 130 may be of either the opposite or a same conductivity type as the well 120. Any conventional material may be used as the insulating layer 180, for example, an oxide.

In certain advantageous embodiments, a first portion of the insulating layer 183 located over the conductive region 140 is thicker than a second portion of the insulating layer 186 located over the well 120. Preferably, the first portion of the insulating layer 183 is thicker than the second portion of the insulating layer 186. It is advantageous to have a thicker insulating layer 183 above the conductive region 140 as compared to the well 120 because the thicker layer 183 reduces the total non-variable capacitance associated with the varactor semiconductor 100. This follows because the fixed capacitance between the conductive region 140 and conductive layer 130 is inversely proportional to the thickness of the insulating layer 180. The thickness of the insulating layer above the conductive region 140 is a direct function of the dopant concentration in the conductive region 140.

In still other advantageous embodiments, at least a portion of the well 122 is further between the conductive region 140 and the conductive layer 130. Such configurations are advantageous because the conductive region 140 can thereby serve to drain current from at least a portion of the well 120 above the conductive region, as well as from other portions of the well 120, such as below and in the same plane as the conductive region 140.

The conductive region 140 preferably forms a network in at least a portion of the well 120. The term network as used herein, refers to one or more of interconnected linear or nonlinear lines or channels of the conductive region 140 in at least a portion of the well 120. In certain embodiments, for example, the network of the conductive region 140 is formed in three dimensions, with at least a portion of the well 120 comprising a volume in substantially the same volume as the three-dimensional conductive network 140.

Figure 2:
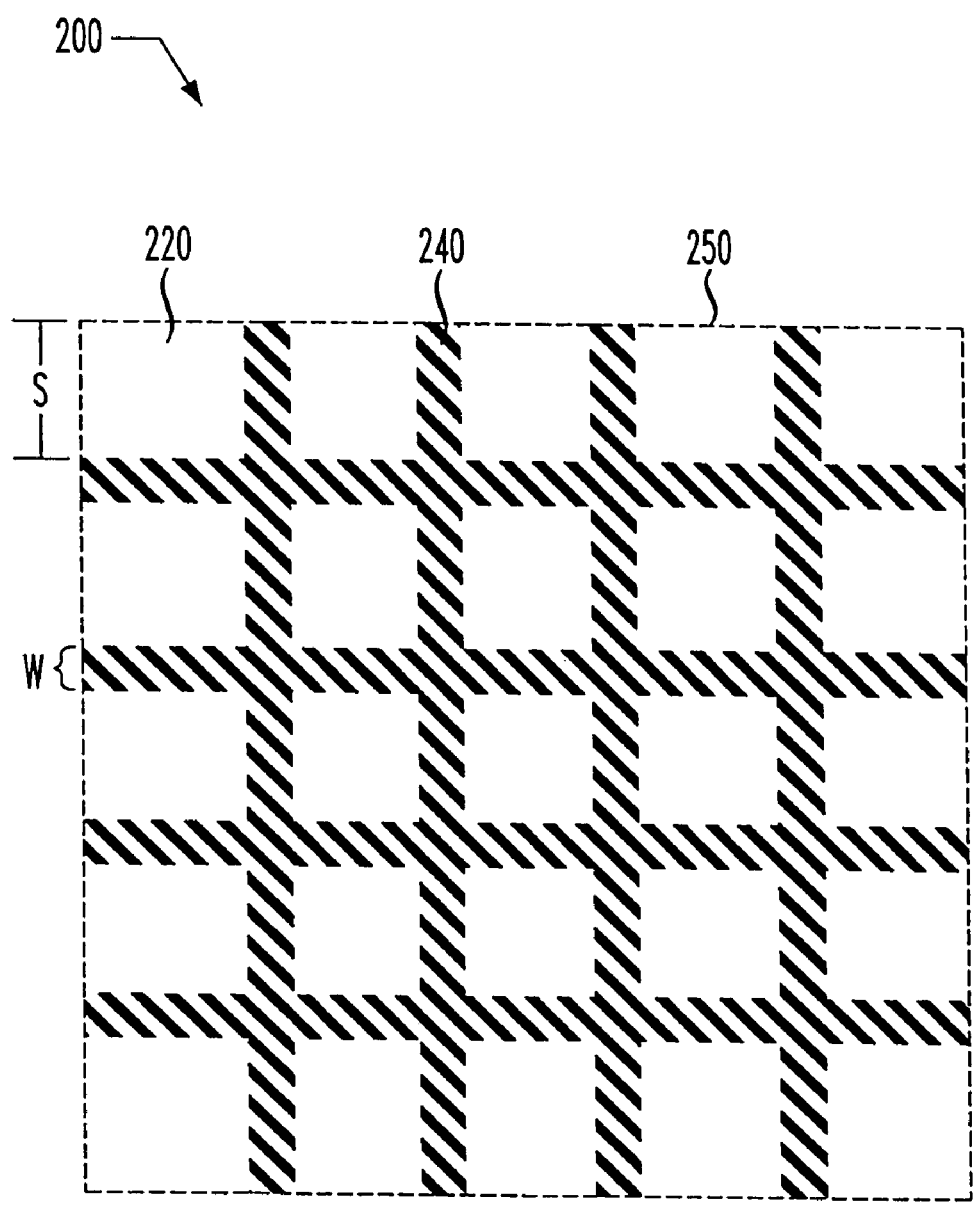
FIG. 2 illustrates a top view of a grid type network of a conductive region in at least a portion of a well region lying under an outer perimeter of a conductor layer.
Figure 3:
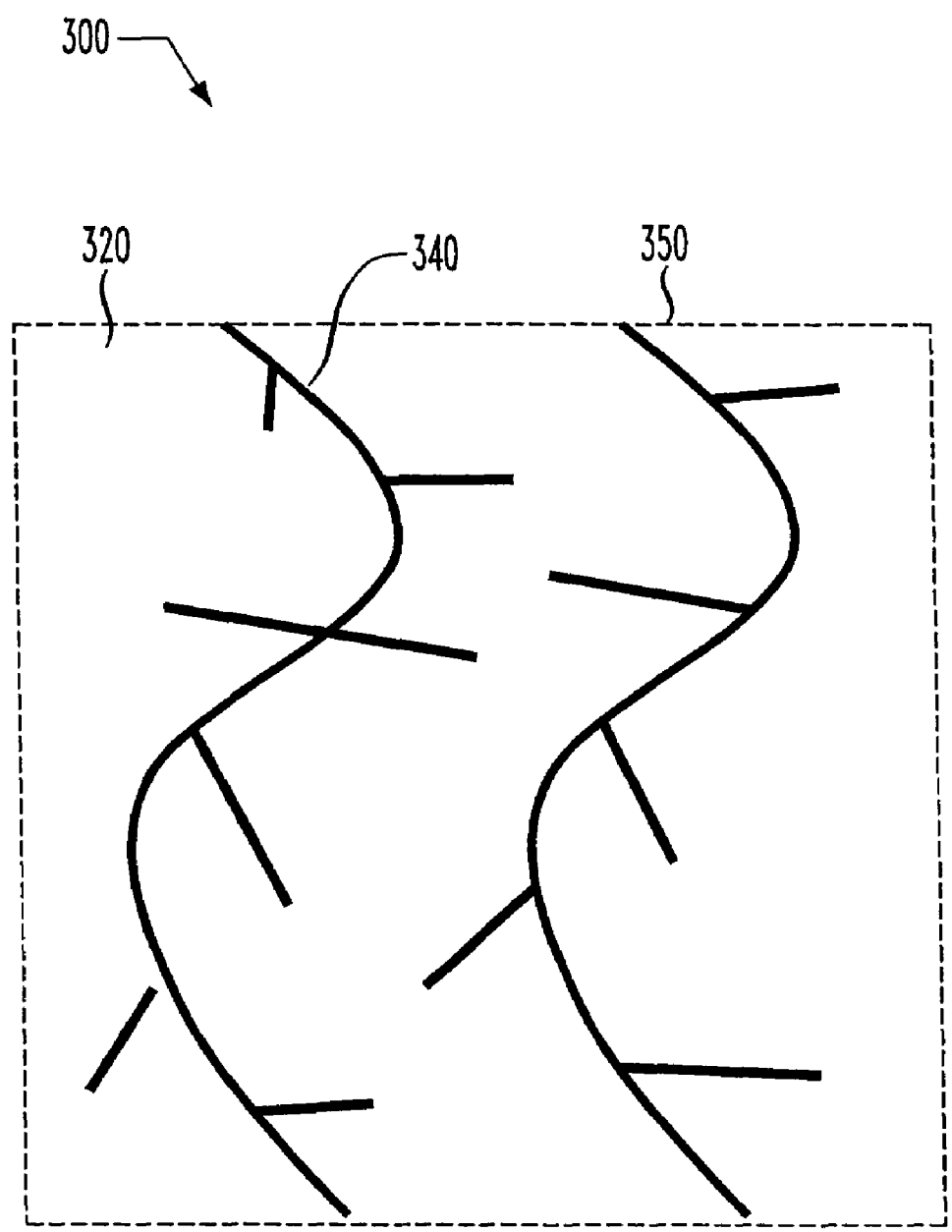
FIG. 3 illustrates a top view of a branching type network of a conductive region in at least a portion of a well region lying under an outer perimeter of a conductor layer.

With continuing reference to FIG. 1 and using an analogous numbering scheme, FIGS. 2 and 3 show top views through a cross-section through particular embodiments of wells 220, 320 analogous to the well 120 shown in FIG. 1, where the conductive region 240, 340 forms a network having a grid 240 (intersecting parallel lines in the same plane) or a branched 340 configuration (intersecting non-parallel lines in the same plane), respectively.

With continuing reference to FIG. 2, when the resistance of the implanted region is smaller than the resistance of the well and when the varactor is operated in frequencies smaller than:

$$l^2/(2*\pi*R*\epsilon*\epsilon_0/d) \tag{1}$$

wherein 1 is the largest dimension of the varactor, R is the ntub sheet resistance (for example about 700 ohm/square), f is the operation frequency, $\epsilon*\epsilon_0$ (for SiO$_2$ for example) is the dielectric constant of the insulator, and d is the insulator thickness. The series resistance (R$_0$) is a direct function of the sheet resistance (R). For example, when the contacts are placed at opposite sides of a square varactor of with a well having a sheet resistance of R the series resistance is $R_0=(1/12)*R$.

Figure 4B:
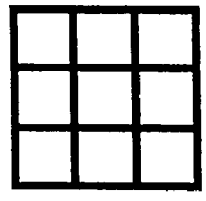
FIG. 4 illustrates the total resistance for a well having a grid comprising a conductive region as compared to a well without the grid.
Figure 4A:
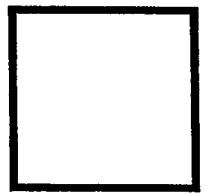

As FIG. 4 shows, when the grid with n units is placed within the varactor well, the series resistance is reduced to $R_0/N$. This approximation is valid as long as the condition in equation (1) is fulfilled, with 1 being the length of a unit of the grid and the resistance of the conductive grid is lower than the resistance of the well. It follows therefore that a ratio of the impedence of a well area with a grid such as that depicted in FIG. 1 as compared to an analogous well area without the grid equals:

$$((j\omega C_0 R_0/N)+1)/(j\omega C_0 R_0)+1 \tag{2}$$

where $C_0$ is the total capacitance, $R_0$ is the cell series resistance, $\omega$ is the angular frequency, and j is a complex number notation.

Another benefit from the present invention is that there is more variable capacitance occupied on a device, such as an oscillator, incorporating the varactor, as compared to previous varactor designs. For instance, referring again to FIG. 1, a single relatively large conductive layer 130 may be placed over a single large well 120 so long as all portions of the well 120 under the outer perimeter 150 of the conductive layer 130 are sufficiently close to the conductive region 140 to allow current drainage.

Figure 5:
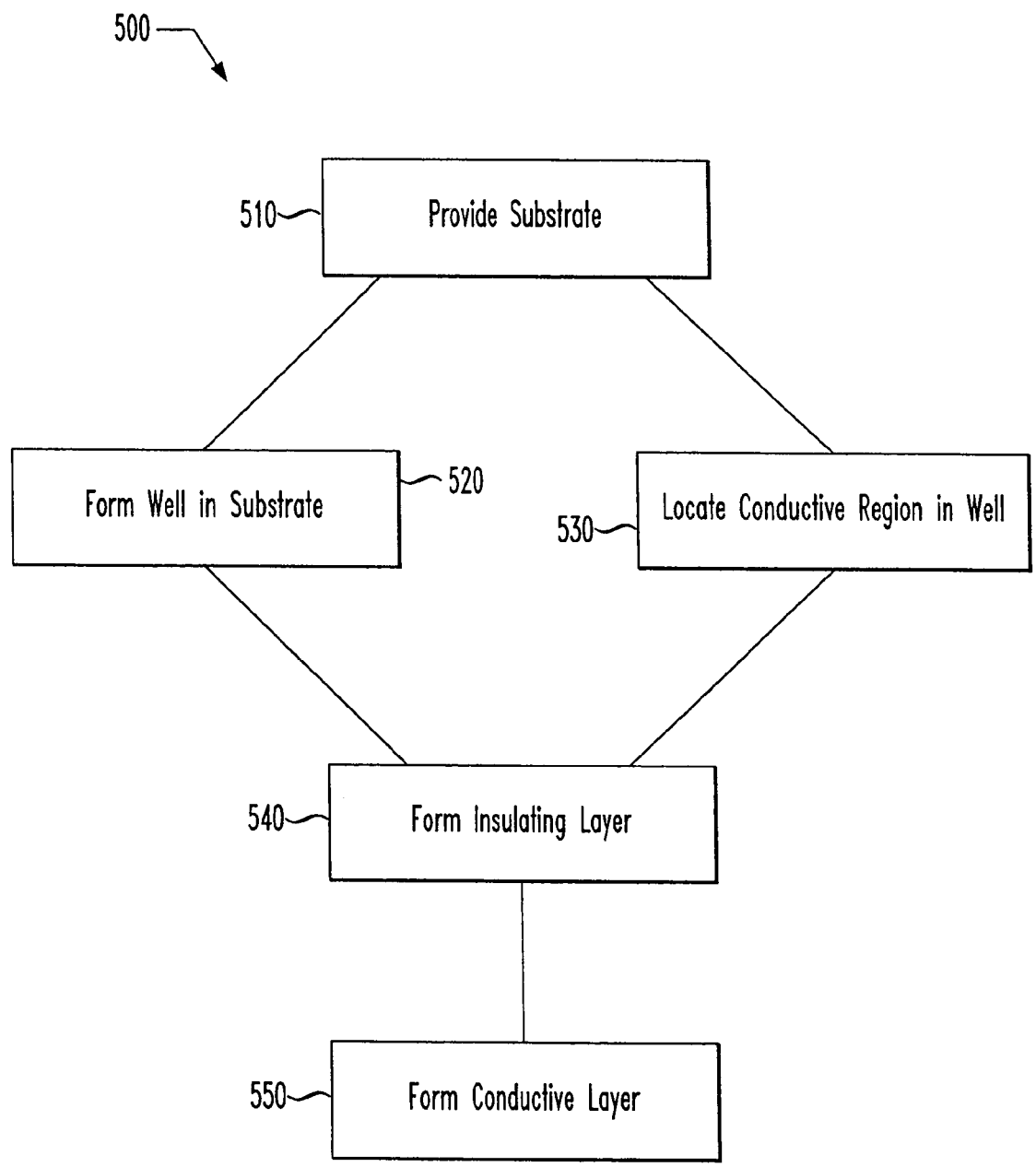
FIG. 5 illustrates, by flow diagram, a method of manufacturing a semiconductor varactor according to the principles present invention.

Yet another aspect of the present invention is a method of manufacturing a semiconductor varactor. As illustrated in the flow diagram in FIG. 5, the method 500 comprises, in step 510, providing a semiconductor substrate of a first conductivity type. In step 520, a well is formed in the semiconductor substrate. A conductive region is located in the well in step 530, where as discussed above, the conductive region has a same conductivity type but a lower resistivity than the well. In step 540, an insulating layer is formed over the well such that at least a portion of the well is between at least two sides of the conductive region and an area delineated by an outer perimeter of the conductive layer.

Preferably, the well is formed in the semiconductor substrate, in step 520, and then the conductive region is formed in the well, in step 550. In other embodiments, however, the conductive region may be formed in the substrate and then the well formed in the substrate, such that the conductive region is in the well. In certain preferred embodiments, the conductive layer is formed, in step 540, so as to have an opposite conductivity type as the well.

In certain preferred embodiments, the method 500 further includes a step 540 of forming an insulating layer on the well. In such embodiments, this is followed by step 550 of forming the conductive layer on the insulating layer. Also in such embodiments, the conductive layer may be formed in step 550 so as to have either the opposite or a same conductivity type as the conductivity type of the well. In a departure from typical MOS capacitor construction, it is also preferable to form the insulating layer, in step 540, after locating the conductive region in the well, in step 530. As indicated previously, during the formation of the insulating layer in step 540, it is preferable to form a first portion of the insulating layer above the conductive region that is thicker than a second portion of the insulating layer located above the well.

Any conventional substrates and processes may be used in the method of manufacturing the semiconductor varactor 500. For example, providing a semiconductor substrate of a first conductivity type, in step 510, may include any conventional materials used to form MOS varactors or P/N Junction varactors. Non-limiting examples of suitable substrates include Silicon or Gallium Arsenide. A substrate of a certain conductivity type in step 510, such as a P-type substrate, may be obtained by doping a silicon wafer with Boron or similar atoms, for example. N-type wells may be formed, in step 520, in P-type substrates, by implanting a portion of the substrate with phosphorus, arsenic or analogous atoms using conventional photolithography and implantation processes. Similarly, locating the conductive region, comprising an N+ doped region, for example, may be achieved by implanting phosphorus, arsenic or analogous atoms, into to the N-type well, in step 530.

It is also advantageous in step 520 to form a portion of the well between the conductive region and the conductive layer, or in certain embodiments, between the conductive region and the insulating layer. In certain embodiments, for example, where the semiconductor substrate comprises GaAs, the conductive region preferably is implanted, and then a portion of the well grown over the conductive region by conventional molecular beam epitaxy. In other embodiments, for example, where the substrate comprises silicon or GaAs, the conductive region preferably is implanted in the well via conventional focused ion beam implantation such that the well is in between the conductive region and conductive layer. Additionally, any combination of the above described processes and materials may be used to locate any of the above described embodiments of a network of the conductive region in the well.

Although the present invention has been described in detail, those skilled in the art should understand that they can make various changes, substitutions and alterations herein without departing from the scope of the invention.

What is claimed is:

1. A semiconductor varactor, comprising:
a semiconductor substrate of a first conductivity type;
a well of a second conductivity type in said semiconductor substrate;
a conductive layer over said well;
a plurality of conductive regions in said well, wherein all of said conductive regions have a same conductivity type as said well but with a lower resistivity than said well, and at least a portion of said well is between at least two sides of said conductive regions and an area delineated by an outer perimeter of said conductive layer, and said conductive regions are located within said area; and
an insulating layer on said well, wherein a first portion of said insulating layer located over said conductive regions is thicker than a second portion of said insulating layer located over said well.

2. The semiconductor varactor as recited in claim 1, where said first and second conductivity types are substantially equal.

3. The semiconductor varactor as recited in claim 1, wherein said at least a portion of said well is further between at least one of said conductive regions and said conductive layer.

4. The semiconductor varactor as recited in claim 1, wherein said conductive regions form a network in said at least a portion of said well.

5. The semiconductor varactor recited in claim 4, wherein said network is a grid.

6. The semiconductor varactor as recited in claim 5, wherein a ratio of impedance of a well area with said grid as compared to an analogous well area without said grid equals:

$$((j\omega C_0 R_0/N)+1)/(j\omega C_0 R_0)+1$$

wherein j is a complex number notation, $\omega$ is angular frequency, said grid has N segments, $C_0$ is a total capacitance of said segments, and $R_0$ is the cell series resistance.

* * * * *